United States Patent
Huang et al.

(10) Patent No.: US 10,051,737 B2
(45) Date of Patent: Aug. 14, 2018

(54) MULTILAYER CIRCUIT STRUCTURE

(71) Applicant: Industrial Technology Research Institute, Hsinchu (TW)

(72) Inventors: Meng-Chi Huang, Taoyuan (TW); Tune-Hune Kao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 32 days.

(21) Appl. No.: 15/461,495

(22) Filed: Mar. 17, 2017

(65) Prior Publication Data

US 2017/0196085 A1    Jul. 6, 2017

Related U.S. Application Data

(62) Division of application No. 14/972,112, filed on Dec. 17, 2015, now Pat. No. 9,642,250.

(30) Foreign Application Priority Data

Oct. 28, 2015    (TW) .............................. 104135497 A

(51) Int. Cl.
| | | |
|---|---|---|
| *C07F 1/00* | (2006.01) | |
| *H05K 1/11* | (2006.01) | |
| *H05K 1/03* | (2006.01) | |
| *H05K 1/09* | (2006.01) | |
| *H05K 1/16* | (2006.01) | |
| *H05K 3/00* | (2006.01) | |
| *H05K 3/42* | (2006.01) | |
| *H05K 3/10* | (2006.01) | |

(52) U.S. Cl.
CPC ........... *H05K 1/115* (2013.01); *H05K 1/0366* (2013.01); *H05K 1/0373* (2013.01); *H05K 1/09* (2013.01); *H05K 1/162* (2013.01); *H05K 1/165* (2013.01); *H05K 3/0026* (2013.01); *H05K 3/421* (2013.01); *H05K 3/423* (2013.01); *H05K 3/0032* (2013.01); *H05K 3/0035* (2013.01); *H05K 3/107* (2013.01); *H05K 2201/09036* (2013.01)

(58) Field of Classification Search
None
See application file for complete search history.

(56) References Cited

U.S. PATENT DOCUMENTS

2002/0076539 A1* 6/2002 Nakamura .............. C08L 63/00
                                                              428/209

* cited by examiner

*Primary Examiner* — Clinton A Brooks
*Assistant Examiner* — Kofi Adzamli
(74) *Attorney, Agent, or Firm* — JCIPRNET

(57) ABSTRACT

An insulating colloidal material and a multilayer circuit structure are provided, wherein the insulating colloidal material includes a resin, trigger particles, and an organic solvent. The trigger particles are selected from the group consisting of organometallic particles and ionic compounds. The ratio of the trigger particles to the insulating colloidal material is between 0.1 wt % and 10 wt %. At least one insulating colloidal layer in the multilayer circuit structure contains the trigger particles.

15 Claims, 4 Drawing Sheets

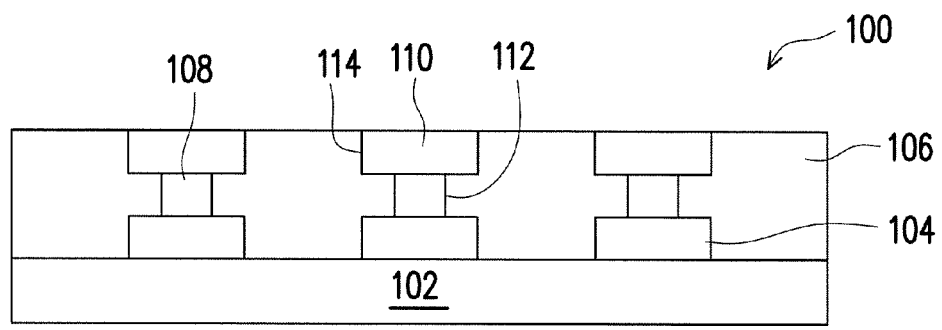
FIG. 1
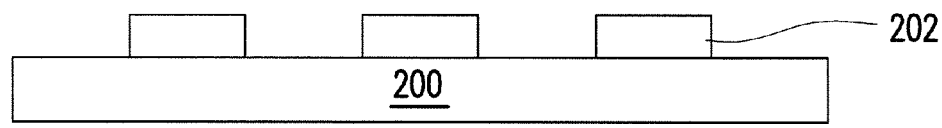
FIG. 2A
FIG. 2B

MULTILAYER CIRCUIT STRUCTURE

CROSS-REFERENCE TO RELATED APPLICATION

This application is a divisional application of U.S. application Ser. No. 14/972,112, filed on Dec. 17, 2015, now allowed. The prior application Ser. No. 14/972,112 claims the priority benefit of Taiwan application serial no. 104135497, filed on Oct. 28, 2015. The entirety of each of the above-mentioned patent applications is hereby incorporated by reference herein and made a part of this specification.

TECHNICAL FIELD

The disclosure is related to an insulating colloidal material and a multilayer circuit structure for a printed circuit board.

BACKGROUND

To meet the market demand for a light, thin, and multi-functional electronic information product, techniques such as high-density interconnect (HDI) and high-layer count (HLC) have gradually been developed in the electronic packaging techniques of a printed circuit board (PCB), such that the electronic circuit density distributed inside the PCB is higher, but the volume is smaller, thus meeting the demand for a lighter and thinner device. A smaller PCB can result in more structural space in the end product design, and more functional components can be added to achieve the design concept of multiple functions on one device.

In particular, the definition of HDI includes a circuit board for which the thickness of a copper metal conductive layer is ≤25 μm, the thickness of an insulating layer is <75 μm, a linewidth of ≤20 μm, a line spacing of ≤20 μm, and an aperture of ≤100 μm. However, the current manufacturing method of an electronic circuit includes forming a copper foil layer by combining sputtering and a method of electroplating or a method of lamination of copper foil on a substrate, and then forming a circuit layer via a method of patterning. Then, the above steps of circuit layer manufacture are repeated to complete a high-density multilayer circuit board.

Electrical connection between the multilayer circuit boards is achieved via vias, and the manufacturing method of the vias can be conceptually divided into the electroplating method and the lamination method. The former includes complicated via process and has higher costs; and the latter cannot achieve thinning and miniaturization since the resulting circuit layer has thicker size and greater linewidth.

SUMMARY

One of the present embodiments comprises an insulating colloidal material. The insulating colloidal material includes a resin, trigger particles, and an organic solvent. The trigger particles are selected from the group consisting of organometallic particles and ionic compounds, wherein the ratio of the trigger particles to the insulating colloidal material is between 0.1 wt % and 10 wt %, and the organometallic particles includes R-M-R' or R-M-X, wherein R and R' are each independently an alkyl group, aromatic hydrocarbon, cycloalkyl, haloalkane, a heterocyclic ring, or carboxylic acid, and the carbon number of at least one of R and R' is 3 or more; M is selected from the group consisting of silver, palladium, copper, gold, tin, and iron, or a combination thereof; and X is a halogen compound or an amine. The ionic compounds include $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

Another of the present embodiments comprises a multilayer circuit structure. The multilayer circuit structure includes a substrate, a first circuit layer located on the substrate, an insulating colloidal layer covering the substrate and the first circuit layer, a via exposing the first circuit layer, and a conductive layer formed in the via. In particular, the via is disposed in the insulating colloidal layer, the insulating colloidal layer includes trigger particles therein, and the trigger particles are selected from the group consisting of organometallic particles and ionic compounds, wherein the ratio of the trigger particles to the insulating colloidal layer is between 0.1 wt % and 10 wt %, and the organometallic particles includes R-M-R' or R-M-X, wherein R and R' are each independently an alkyl group, aromatic hydrocarbon, cycloalkyl, haloalkane, a heterocyclic ring, or carboxylic acid, and the carbon number of at least one of R and R' is 3 or more; M is selected from the group consisting of silver, palladium, copper, gold, tin, and iron, or a combination thereof; and X is a halogen compound or an amine. The ionic compounds include $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

In order to make the aforementioned features of the disclosure more comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 1 is a cross-section of a multilayer circuit structure according to an embodiment of the disclosure.

FIG. 2A to FIG. 2E are cross-sections of the manufacturing process of the multilayer circuit structure of FIG. 1.

DETAILED DESCRIPTION OF DISCLOSED EMBODIMENTS

Figure 2C:
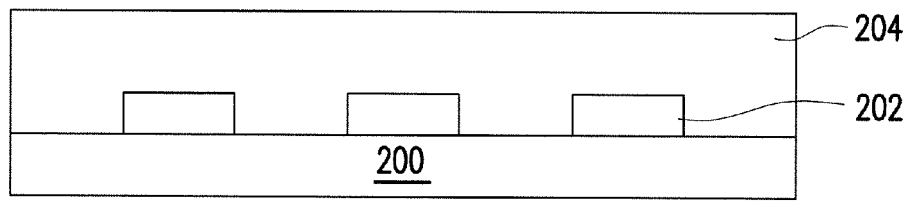

In the following, the embodiments of the disclosure are described in detail. These descriptions are intended to explain the structure or the step process of the disclosure, and are not intended to limit the disclosure, and therefore the disclosure is not limited thereto.

In an embodiment of the disclosure, an insulating colloidal material contains a resin, trigger particles, and an organic solvent.

The resin is, for instance, an epoxy resin, polyphenylene oxide (PPO), bismaleimide triazine (BT), a cyclo olefin copolymer (COC), polyimide (PI), or a liquid crystal polymer (LCP).

The trigger particles are selected from the group consisting of organometallic particles and ionic compounds. The organometallic particles includes R-M-R' or R-M-X, wherein R and R' are each independently an alkyl group, aromatic hydrocarbon, cycloalkyl, haloalkane, a heterocyclic ring, or carboxylic acid. The carbon number of at least one of R and R' is 3 or more. The more the carbon number, the greater the solubility with the organic solvent, and thus it is easier to dissolve in the polymer colloid (i.e. the resin and the organic solvent). However, if the carbon number is insufficient, the trigger particles are only miscible with a high-polar solvent and not easy to dissolve in the polymer colloid. M is selected from the group consisting of silver, palladium, copper, gold, tin, and iron, or a combination thereof X is a halogen compound or an amine. The ionic compounds include $CuCl_2$, $Cu(NO_3)_2$, $CuSO_4$, $Cu(OAc)_2$, AgCl, $AgNO_3$, $Ag_2SO_4$, Ag(OAc), Pd(OAc), $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$. The organometallic particles and the ionic compounds can be used alone or in a combination of two or more.

The organic solvent may be a low-polar organic solvent, in particular an organic solvent miscible with the trigger particles and the resin, such as methanol, acetone, toluene, methyl ethyl ketone, dipropylene glycol methyl ether (DPM), or propylene glycol monomethyl ether acetate. For instance, the solubility of the trigger particles in the organic solvent is greater than 0.1 wt %. Since the trigger particles are completely miscible with the organic solvent, and are therefore completely miscible with the resin, the ratio of the trigger particles to the insulating colloidal material is 10 wt % or less, thus facilitating the use of the insulating colloidal material in a high-frequency circuit board system.

Moreover, the viscosity coefficient of the insulating colloidal material is, for example, between 10,000 and 200,000, therefore facilitating the use of the insulating colloidal material in the coating process of a general multilayer circuit.

Moreover, when the insulating colloidal material is to be in contact with a chip and a device, and the contact area is large, the coefficient of thermal expansion between different materials can be reduced and the modulus of rigidity thereof can be increased by adding particles of silicon dioxide, aluminum oxide, or aluminum nitride to prevent peeling or warping of the resulting film layer.

Moreover, in the insulating colloidal material, other components such as an absorbent, a colorant, or a fiber material can also be added. The absorbent is, for instance, methylbenzene dithiol or pyridine containing Co, Ni, or Fe for increasing the reaction of the resin in the insulating colloidal material and a laser light, whereby reducing the laser wattage needed for the vaporization of the insulating colloidal material by the laser. The colorant, for example, is a general dye, such as an inorganic colorant or an organic colorant. The inorganic colorant is, for instance, carbon black or titanium dioxide; and the organic colorant is, for instance, an azo pigment (—N=N—), copper phthalocyanine blue ($C_{32}H_{10}N_8Cu$), or phthalocyanine green ($C_{32}HCl_{15}N_8Cu$). The fiber material can be, for instance, glass fiber or carbon fiber for improving the mechanical strength of the molded product of the insulating colloidal material.

In an embodiment, the additive amount of the absorbent is, for instance, 0.1 wt % to 10 wt % of the total amount of the insulating colloidal material, and the additive amount of the colorant is, for instance, 1 wt % to 45 wt % of the total amount of the insulating colloidal material.

FIG. 1 is a cross-section of a multilayer circuit structure according to an embodiment of the disclosure.

Referring to FIG. 1, a multilayer circuit structure 100 of the present embodiment includes a substrate 102, a first circuit layer 104 located on the substrate 102, an insulating colloidal layer 106 covering the substrate 102 and the first circuit layer 104, a conductive layer 108, and a second circuit layer 110, wherein the insulating colloidal layer 106 has a via 112 exposing the first circuit layer 104, a trench 114 can be disposed on the via 112, such that the conductive layer 108 is formed in the via 112, and the second circuit layer 110 is formed in the trench 114, but the disclosure is not limited thereto. In another embodiment, a trench is not on the via 112, and therefore the second circuit layer 110 is not in the insulating colloidal layer 106. The substrate 102 is, for instance, glass, sapphire, silicon, silicon germanium, silicon carbide, gallium nitride, or a polymer material (e.g. polyimide or polyamide). The insulating colloidal layer 106 is made by the insulating colloidal material in the last embodiment, and therefore the insulating colloidal layer 106 contains the above trigger particles therein, and the ratio of the trigger particles to the insulating colloidal layer 106 is 10 wt % or less. Moreover, a material of the insulating colloidal layer comprises PPO, BT, a cyclo olefin copolymer (COC), a liquid crystal polymer (LCP), PI, or an epoxy resin, for instance.

When the via 112 and the trench 114 are formed in the insulating colloidal layer 106 via laser processing, the trigger particles around the via 112 and the trench 114 are activated, and the conductive layer 108 and the second circuit layer 110 can be formed directly by, for instance, a method of non-electroplating process according to the exposed and activated trigger particles, and therefore a complicated process such as sputtering is not needed. In the present embodiment, the material of the conductive layer 108 and/or the second circuit layer 110 is, for instance, copper, nickel, or silver.

In the following, the manufacturing process of the multilayer circuit structure of FIG. 1 is more specifically described with reference to FIG. 2A to FIG. 2E.

First, a substrate 200 (as shown in FIG. 2A) is provided, and the surface of the substrate 200 can be a flat surface or any shape.

Then, a first circuit layer 202 (as shown in FIG. 2B) is formed on the substrate 200. The first circuit layer 202 can be a conductive structure in a semiconductor device, and can also be one of the layers of conductive wire in multiple layers of circuit.

Then, an insulating colloidal layer 204 (as shown in FIG. 2C) is formed above the substrate 200 and the first circuit layer 202. The method of forming the insulating colloidal layer 204 includes coating the insulating colloidal material in the above embodiment on the substrate 200 and the first circuit layer 202, and then performing heating to remove the organic solvent so as to cure the insulating colloidal material. Since the trigger particles in the insulating colloidal layer 204 are very few, a dielectric constant $D_k$ and a dielectric loss $D_f$ of the cured insulating colloidal layer 204 still retain the characteristics thereof.

Figure 2D:
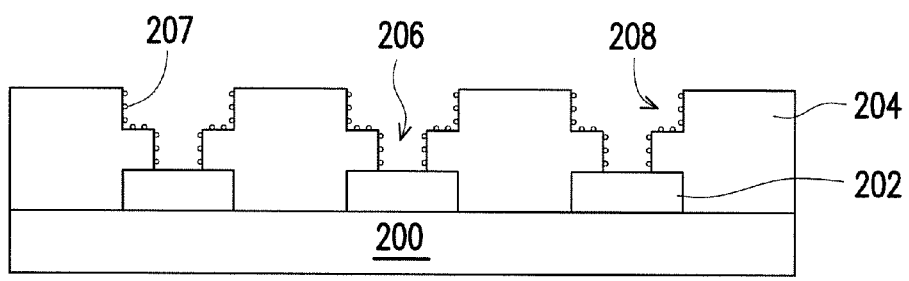

Then, a plurality of vias 206 and a plurality of trenches 208 are formed in the insulating colloidal layer 204 through laser (as shown in FIG. 2D), and after the resin of the insulating colloidal layer 204 is removed by the high temperature of the laser, the first circuit layer 202 is exposed and a portion of the trigger particles 207 inside the insulating colloidal layer 204 is activated, and the activated trigger particles 207 are deposited on the sidewalls of the vias 206 and the trenches 208, wherein the laser may be a high-energy laser (such as YAG laser) or argon gas laser, and the wavelength of the laser light is, for instance, between 200 nm and 1100 nm, but it is not limited thereto. The depth, the width, and the shape of each of the vias 206 and the trenches 208 can be modified according to product requirements. For instance, FIG. 2D shows a dual-damascene structure formed by the trenches 208 and vias (i.e., the vias 206); alternatively, a single via 206 can also be formed only in the insulating colloidal layer 204 without the trenches 208.

Figure 2E:
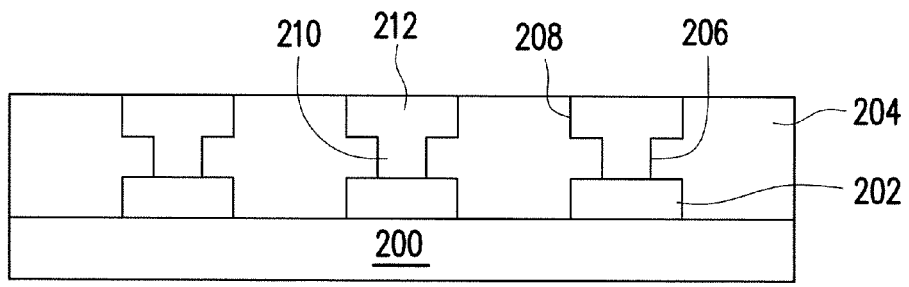

Then, a metal material is deposited on the walls of the vias 206 and the trenches 208 via the activated trigger particles 207 in FIG. 2D to form a conductive layer 210 and a second circuit layer 212 (as shown in FIG. 2E). In the case of a non-electroplating process, the structure shown in FIG. 2D can be dipped in an electroplating solution, and a redox reaction occurs between the metal ions to be plated in the electroplating solution and the activated trigger particles 207 exposed from the vias 206 and the trenches 208, such that the metal ions are reduced to metal and deposited on the surfaces of the vias 206 and the trenches 208, and the vias 206 and the trenches 208 are completely filled.

Figure 3:
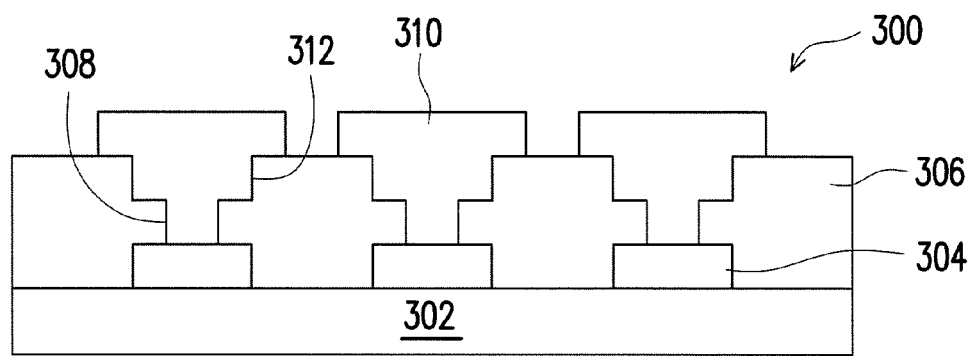
FIG. 3 is a cross-section of a modified example of the multilayer circuit structure of FIG. 1.

Moreover, the second circuit layer 110 in FIG. 1 is located inside the trench 112, but the disclosure is not limited thereto. Referring to FIG. 3, a substrate 302, a first circuit layer 304, and an insulating colloidal layer 306 in a multilayer circuit structure 300 are all as described for the same components in FIG. 1, but a second circuit layer 310 is extended from within a via 308 to the surface of the insulating colloidal layer 306. The reason is that, in addition to forming the via 308 and the trench 312, the laser can also pattern the surface of the insulating colloidal layer 306, such that the trigger particles therein are activated, and as a result are extended to outside the trench 312 when the second circuit layer 310 is formed.

Experimental examples are described below to verify the efficacy of the disclosure. However, the disclosure is not limited to the following content.

EXPERIMENTAL EXAMPLE 1

First, an insulating colloidal material was prepared. In detail, 0.5 wt % of $CuCl_2$ was dissolved in methanol, and then the mixture was uniformly mixed with 50 wt % of an epoxy resin, wherein 1 wt % of a colorant (carbon black) was further added. Then, referring to FIG. 4, a scanning electronic microscopy (SEM) cross-section of the multilayer circuit structure of experimental example 1 is shown. An insulating colloidal layer was coated on a polyimide (PI) soft board 400 on which a first insulating colloidal layer 402 and a first circuit layer 404 were formed, and then a second insulating colloidal layer 406 having a thickness of 100 μm was formed via thermal curing.

Figure 4:
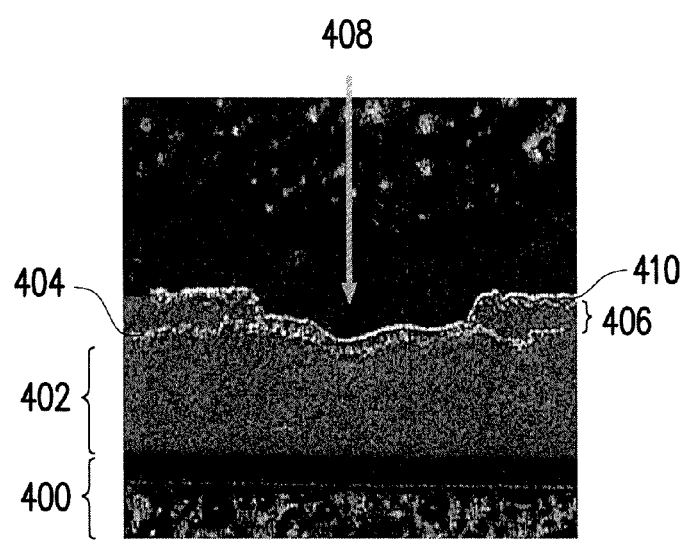
FIG. 4 is a SEM cross-section of the multilayer circuit structure in experimental example 1.

Then, the second insulating colloidal layer 406 was directly patterned by using argon gas laser having a wavelength of 1064 nm as the laser source, such that a via 408 was formed and the trigger particles inside the second insulating colloidal layer 406 were exposed. Thereafter, a non-electroplating copper process was performed via the exposed trigger particles to complete the manufacture of a conductive layer 410. The thickness of the resulting conductive layer 410 is about 10 μm. The second circuit layer 410 in FIG. 4 is thinner, and therefore the second circuit layer 410 in FIG. 4 was formed along the surface of the via 408, and the conductive layer 410 was extended outside the via 408.

EXPERIMENTAL EXAMPLES 2 TO 5

Other than respectively using 1 wt %, 3 wt %, 10 wt %, and 13 wt % of $CuCl_2$ as the trigger particles, insulating colloidal materials were prepared and multilayer circuit structures were made according to the steps of experimental example 1.

COMPARATIVE EXAMPLE 1

Other than using 20 wt % of $CuCl_2$, an insulating colloidal material was prepared and a multilayer circuit structure was made according to the steps of experimental example 1.

COMPARATIVE EXAMPLE 2

Except for the absent of $CuCl_2$, an insulating colloidal material was prepared and a multilayer circuit structure was made according to the steps of experimental example 1.

The testing shows that the resistances of both the first circuit layer 404 and the conductive layer 410 of experimental example 1 are 1.5Ω or less.

Moreover, the dielectric constant $D_k$ and the dielectric loss $D_f$ of the second insulating colloidal layers of experimental examples 1 to 5 and comparative examples 1 to 2 were tested, and the results are shown in Table 1 below.

TABLE 1

| Frequency | Amount of trigger particles | $D_k$ | $D_f$ |
| --- | --- | --- | --- |
| Experimental example 1 @ 2 GHz | 0.5 wt % | 3.0247 | 0.04786 |
| Experimental example 2 @ 2 GHz | 1 wt % | 3.0872 | 0.05012 |
| Experimental example 3 @ 2 GHz | 3 wt % | 3.5863 | 0.0522 |
| Experimental example 4 @ 2 GHz | 10 wt % | 5.0235 | 0.0731 |
| Experimental example 5 @ 2 GHz | 13 wt % | 5.7541 | 0.0923 |
| Comparative example 1 @ 2 GHz | 20 wt % | 7.1322 | 0.1589 |
| Comparative example 2 @ 2 GHz | 0 wt % | 2.9871 | 0.04631 |

It can be known from Table 1 that, since the amount of the trigger particles ($CuCl_2$) in experimental examples 1 to 5 is small, the dielectric constant $D_k$ and the dielectric loss $D_f$ of the second insulating colloidal layer formed after curing still retain the original characteristics of the insulating material, and $D_k$ and $D_f$ are not significantly increased. However, once the amount of the trigger particles exceeds the scope of the disclosure, $D_k$ and $D_f$ of the insulating colloidal layer are significantly increased.

Figure 5A:
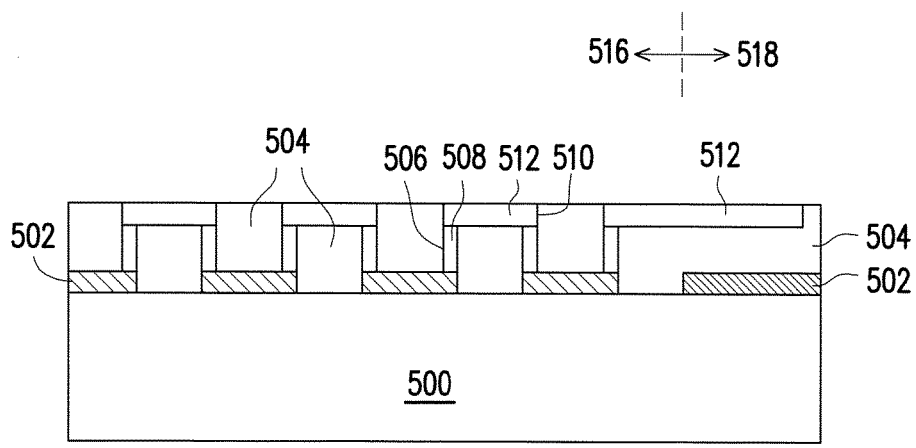
FIG. 5A and FIG. 5B are respectively cross-sections of two multilayer circuit structures according to another embodiment of the disclosure.

FIG. 5A is a cross-section of a multilayer circuit structure according to another embodiment of the disclosure.

Referring to FIG. 5A, the multilayer circuit structure of the present embodiment includes a substrate 500, a first circuit layer 502 located on the substrate 500, an insulating colloidal layer 504 covering the substrate 500 and the first circuit layer 502, a via 506 exposing the first circuit layer 502, a conductive layer 508 formed in the via 506, a trench 510 connected to the via 506, and a second circuit layer 512 formed in the trench 510. The material, the size, and the manufacturing method . . . etc. of each of the insulating colloidal layer 504, the conductive layer 508, and the second circuit layer 512 are all as described in the content of each of the above embodiments. In FIG. 5A, the first circuit layer 502, the conductive layer 508, and the second circuit layer 512 located in an inductance region 516 can form an inductor; and the first circuit layer 502, the insulating colloidal layer 504, and the second circuit layer 512 in a capacitance region 518 can form a capacitor.

Figure 5B:
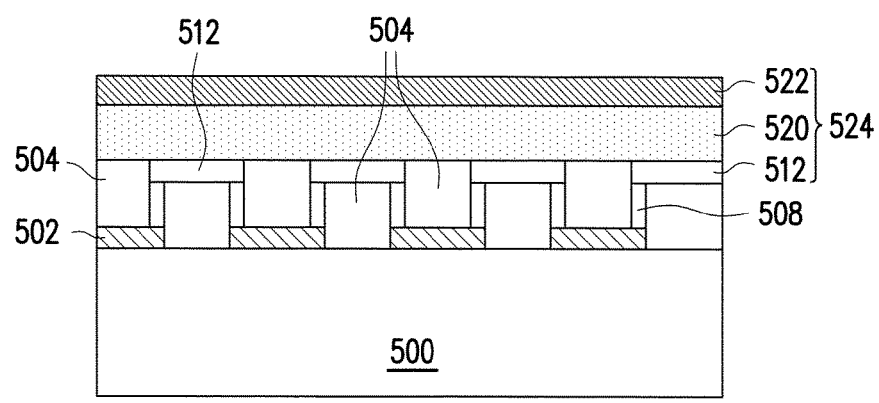

FIG. 5B is a cross-section of another multilayer circuit structure according to another embodiment of the disclosure, wherein the same reference numerals as in FIG. 5A are used to represent the same or similar components.

In FIG. 5B, the multilayer circuit structure can further include one dielectric layer 520 formed on the second circuit layer 512 and a third circuit layer 522 formed on the dielectric layer 520, wherein the dielectric layer 520 can be formed by a general dielectric material or formed by the same material as the insulating colloidal layer 504. Therefore, the third circuit layer 522 can be a metal layer formed by a process such as coating, deposition, or photolithoetching, and the third circuit layer 522 can also be formed via the methods of FIG. 2D and FIG. 2E. The second circuit layer 512, the dielectric layer 520, and the third circuit layer 255 can form a capacitor 524; and the first circuit layer 502, the conductive layer 508, and the second circuit layer 512 connected to one another can form an inductor.

Based on the above, the insulating colloidal material of the disclosure includes a resin, trigger particles, and an organic solvent. After the organic solvent is removed by curing the insulating colloidal material, drilling is performed via laser, and since the exposed trigger particles are suitable for a subsequent non-electroplating copper deposition process of copper after the resin is removed by the high temperature of the laser, in the disclosure, a multilayer circuit structure having fine conductive wires and small vias can be formed via a simple process, so as to meet the market demand for a lighter and thinner device. Moreover, the insulating colloidal layer of the multilayer circuit structure of the disclosure contains 0.1 wt % to 10 wt % of the trigger particles therein, such that the dielectric constant $D_k$ and the dielectric loss $D_f$ of the insulating colloidal layer still retain the original characteristics of the insulating material. As a result, during the manufacture of circuits, the circuits can be the insulating layers in the multiple layers of circuit at the same time. Moreover, by using laser drilling and a non-electroplating copper process, fine conductive wires and small vias can be formed. Therefore, the insulating colloidal layer above can be used as a dielectric layer and used as a base layer for forming a conductive layer at the same time. More specifically, the volume of the multilayer circuit structure can be significantly reduced, thus meeting the market demand for a lighter and thinner device.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A multilayer circuit structure, comprising:
a substrate;
a first circuit layer located on the substrate;
an insulating colloidal layer covering the substrate and the first circuit layer, wherein the insulating colloidal layer comprises a via, and the via exposes the first circuit layer; and
a conductive layer formed in the via,
wherein the insulating colloidal layer comprises trigger particles therein, and the trigger particles are selected from the group consisting of organometallic particles and ionic compounds, wherein a ratio of the trigger particles to the insulating colloidal layer is between 0.1 wt % and 10 wt %, and
the organometallic particles comprises R-M-R' or R-M-X, wherein R and R' are each independently an alkyl group, aromatic hydrocarbon, cycloalkyl, haloalkane, a heterocyclic ring, or carboxylic acid, and a carbon number of at least one of R and R' is 3 or more; M is selected from the group consisting of silver, palladium, copper, gold, tin, and iron, or a combination thereof; and X is a halogen compound or an amine;
the ionic compounds comprise $CuCl_2$, $Cu(NO_3)_2$, $CuSO_4$, $Cu(OAc)_2$, $AgCl$, $AgNO_3$, $Ag_2SO_4$, $Ag(OAc)$, $Pd(OAc)$, $PdCl_2$, $Pd(NO_3)_2$, $PdSO_4$, $Pd(OAc)_2$, $FeCl_2$, $Fe(NO_3)_2$, $FeSO_4$, or $[Fe_3O(OAc)_6(H_2O)_3]OAc$.

2. The multilayer circuit structure of claim 1, wherein the substrate comprises glass, sapphire, silicon, silicon germanium, silicon carbide, gallium nitride, or a polymer material.

3. The multilayer circuit structure of claim 1, wherein a material of the insulating colloidal layer comprises polyphenylene oxide (PPO), bismaleimide triazine (BT), a cyclo olefin copolymer (COC), a liquid crystal polymer (LCP), polyimide (PI), or an epoxy resin.

4. The multilayer circuit structure of claim 1, wherein a material of the conductive layer comprises copper, nickel, or silver.

5. The multilayer circuit structure of claim 1, wherein the insulating colloidal layer further comprises a trench formed on the via.

6. The multilayer circuit structure of claim 5, further comprising a second circuit layer formed in the trench on the conductive layer.

7. The multilayer circuit structure of claim 6, wherein the second circuit layer further extends from within the trench to a surface of the insulating colloidal layer.

8. The multilayer circuit structure of claim 6, wherein the first circuit layer, the conductive layer, and the second circuit layer form an inductor.

9. The multilayer circuit structure of claim 6, wherein the first circuit layer, the insulating colloidal layer, and the second circuit layer form a capacitor.

10. The multilayer circuit structure of claim 6, further comprising: a dielectric layer formed on the second circuit layer; and a third circuit layer formed on the dielectric layer, wherein the second circuit layer, the dielectric layer, and the third circuit layer form a capacitor.

11. The multilayer circuit structure of claim 1, wherein the insulating colloidal layer further comprises an absorbent or a colorant.

12. The multilayer circuit structure of claim 11, wherein the colorant comprises carbon black, titanium dioxide, or an organic colorant.

13. The multilayer circuit structure of claim 1, wherein the insulating colloidal layer further comprises a fiber structure.

14. The multilayer circuit structure of claim 1, wherein the insulating colloidal layer further comprises particles of silicon dioxide, aluminum oxide, or aluminum nitride.

15. The multilayer circuit structure of claim 1, wherein a ratio of the trigger particles to the insulating colloidal material is between 0.5 wt % and 10 wt %.

* * * * *